(12) United States Patent
Wu et al.

(10) Patent No.: US 7,005,332 B2
(45) Date of Patent: Feb. 28, 2006

(54) FABRICATION METHOD OF THIN FILM TRANSISTOR

(75) Inventors: Ying-Ming Wu, Taoyuan (TW); Ta-Jung Su, Changhua (TW); Yi-Tsai Hsu, Taoyuan (TW); Chin-Tzu Kao, Changhua (TW)

(73) Assignee: Chunghwa Picture Tubes, Ltd., Taipei (TW)

( * ) Notice: Subject to any disclaimer, the term of this patent is extended or adjusted under 35 U.S.C. 154(b) by 0 days.

(21) Appl. No.: 11/019,074

(22) Filed: Dec. 21, 2004

(65) Prior Publication Data

US 2006/0008952 A1    Jan. 12, 2006

(30) Foreign Application Priority Data

Jul. 6, 2004    (TW) .............................. 93120230 A

(51) Int. Cl.
*H01L 21/336* (2006.01)
(52) U.S. Cl. ................................... 438/158
(58) Field of Classification Search ............... 438/158, 438/FOR 200; 257/E21.025, E21.378, E21.411
See application file for complete search history.

(56) References Cited

U.S. PATENT DOCUMENTS

| 4,684,435 A | * | 8/1987 | Kishi et al. ................. 438/158 |
| 5,391,507 A | * | 2/1995 | Kwasnick et al. ........... 438/158 |
| 5,953,595 A | * | 9/1999 | Gosain et al. ............... 438/158 |
| 6,376,288 B1 | * | 4/2002 | Jen et al. ..................... 438/158 |
| 2002/0140889 A1 | * | 10/2002 | Nishiki et al. ............... 349/122 |
| 2004/0063254 A1 | * | 4/2004 | Wang et al. ................. 438/149 |
| 2005/0077516 A1 | * | 4/2005 | Lim et al. ..................... 257/59 |
| 2005/0077522 A1 | * | 4/2005 | Chang et al. .................. 257/72 |

FOREIGN PATENT DOCUMENTS

JP         56018467 A    *  2/1981

* cited by examiner

*Primary Examiner*—George Fourson
(74) *Attorney, Agent, or Firm*—Welsh & Katz, Ltd.

(57) ABSTRACT

A TFT fabrication method includes: forming a gate insulation layer, a semiconductor layer and a metal layer on a substrate in sequence, which cover a gate; patterning the metal layer and the semiconductor layer; forming a patterned first passivation layer on the substrate and exposing the patterned metal layer; forming a pixel electrode layer on the substrate to cover the patterned first passivation layer and the patterned metal layer; forming a patterned photoresist layer on the substrate and exposing the pixel electrode layer above the gate; etching the pixel electrode layer and the patterned metal layer to form a patterned pixel electrode layer, a source, and a drain to form a channel region on the patterned semiconductor layer; forming a second passivation layer on the substrate; and removing the patterned photoresist layer to lift off the second passivation layer, thereby exposing the patterned pixel electrode layer.

21 Claims, 5 Drawing Sheets

FABRICATION METHOD OF THIN FILM TRANSISTOR

BACKGROUND OF THE INVENTION

1. Field of Invention

The invention relates to a thin-film transistor (TFT) fabrication method and, in particular, to a fabrication method of TFT using four-mask process.

2. Related Art

FIGS. 1A to 1F show the cross-sectional views of a conventional TFT fabrication method. As shown in FIG. 1A, a first metal is deposited on an insulating substrate 100 by sputtering (not shown). The first metal layer is etched to form a gate 101 on the substrate 100. The substrate 100 is alkaline-free glass. The first metal layer can be an Al, Cr or Mo layer. The etching process is a wet etching process.

As shown in FIG. 1B, the plasma enhanced chemical vapor deposition (PECVD) method is employed to deposit a gate insulation layer 102, a semiconductor layer 103, and an ohmic contact layer 104 on the substrate 100 to cover the gate 101 in sequence. A Photolithographic and etching process is used to pattern the semiconductor layer 103 and the ohmic contact layer 104, and then a patterned ohmic contact layer 104 and a patterned semiconductor layer 103 are formed. The etching method is a dry etching process. The semiconductor layer 103 is an amorphous silicon layer. The ohmic contact layer 104 is an n-doped amorphous silicon layer. The gate insulation layer 102 is a silicon nitride layer.

As shown in FIGS. 1C and 1D, a second metal layer 105 is deposited on the ohmic contact layer 104 by sputtering to cover the gate insulation layer 102. A photolithographic and etching process is employed to etch the second metal layer 105, and then the second metal layer 105 is patterned to form a source 105a and a drain 105b. A back channel etching (BCE) process is used to etch the ohmic contact layer 104 and the semiconductor layer 103 to form a channel region 106. The second metal layer 105 may be an Al, Cr, or Mo layer.

As shown in FIG. 1E, the PECVD method is used to deposit a passivation layer 107 over the substrate 100, covering the patterned second metal layer 105 and the gate insulation layer 102. A photolithographic and etching process is employed to etch the passivation layer 107 to form a patterned passivation layer 107. A contact hole 108 is formed above the drain 105b. The passivation layer 107 is a silicon nitride layer.

As shown in FIG. 1F, a pixel electrode layer 109 is deposited on the substrate 100 by sputtering. A photolithographic and etching process is employed to pattern the pixel electrode layer 109. The pixel electrode layer 109 is made of indium tin oxide (ITO).

SUMMARY OF THE INVENTION

An objective of the invention is to provide a fabrication method of TFT, which uses fewer processes to save time and costs and increases the yield and thus the production efficiency.

The disclosed TFT fabrication method includes the steps of: forming a gate on a substrate; forming a gate insulation layer, a semiconductor layer, and a metal layer on the substrate in sequence, which cover the gate; patterning the metal layer and the semiconductor layer to form a patterned metal layer and a patterned semiconductor layer covering the gate; forming a patterned first passivation layer on the substrate and exposing the patterned metal layer; forming a pixel electrode layer on the substrate to cover the patterned first passivation layer and the patterned metal layer; forming a patterned photoresist layer on the substrate and exposing the pixel electrode layer above the gate; etching the pixel electrode layer and the patterned metal layer above the gate to form a patterned pixel electrode layer, a source, and a drain to form a channel region on the patterned semiconductor layer; forming a second passivation layer on the substrate; and removing the patterned photoresist layer to lift off the second passivation layer, thereby exposing the patterned pixel electrode layer.

According to another embodiment of the invention, the disclosed method includes the steps of: forming a gate on a substrate; forming a gate insulation layer, a semiconductor layer, an ohmic contact layer, and a metal layer on the substrate in sequence, which cover the gate; patterning the metal layer, the ohmic contact layer, and the semiconductor layer to form a patterned metal layer, a patterned ohmic contact layer, and a patterned semiconductor layer covering the gate; forming a patterned first passivation layer on the substrate and exposing the patterned metal layer; forming a pixel electrode layer on the substrate to cover the patterned first passivation layer and the patterned metal layer; forming a patterned photoresist layer on the substrate and exposing the pixel electrode layer above the gate; etching the pixel electrode layer, the patterned ohmic contact layer and the patterned metal layer above the gate to form a patterned pixel electrode layer, a source and a drain and to form a channel region on the patterned semiconductor layer; forming a second passivation layer on the substrate; and removing the patterned photoresist layer to lift off the second passivation layer, thereby exposing the patterned pixel electrode layer.

BRIEF DESCRIPTION OF THE DRAWINGS

The invention will become more fully understood from the detailed description given hereinbelow illustration only, and thus are not limitative of the present invention, and wherein.

DETAILED DESCRIPTION OF THE INVENTION

Figure 1A:
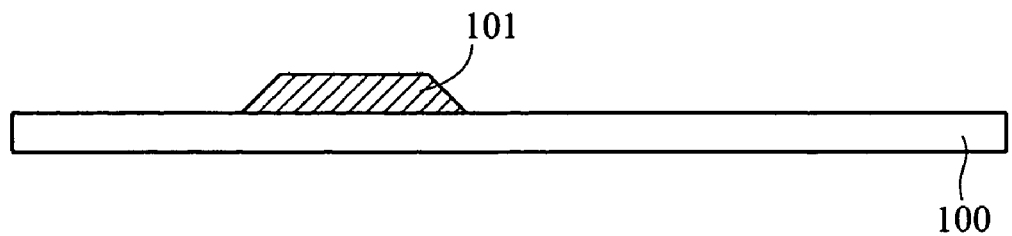
FIGS. 1A to 1F show cross-sectional views of a conventional TFT fabrication method.
Figure 1B:
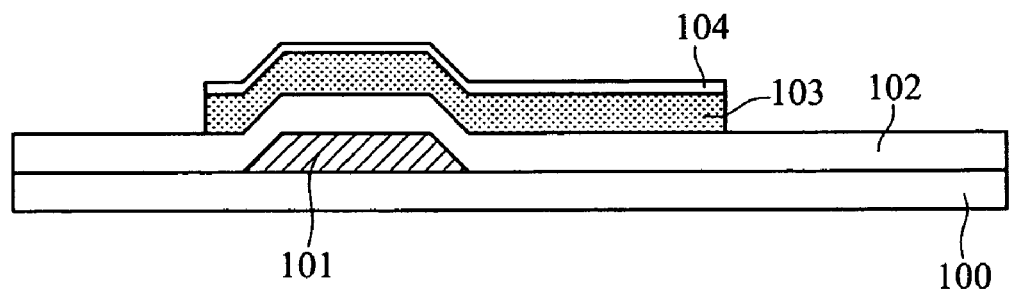
Figure 1C:
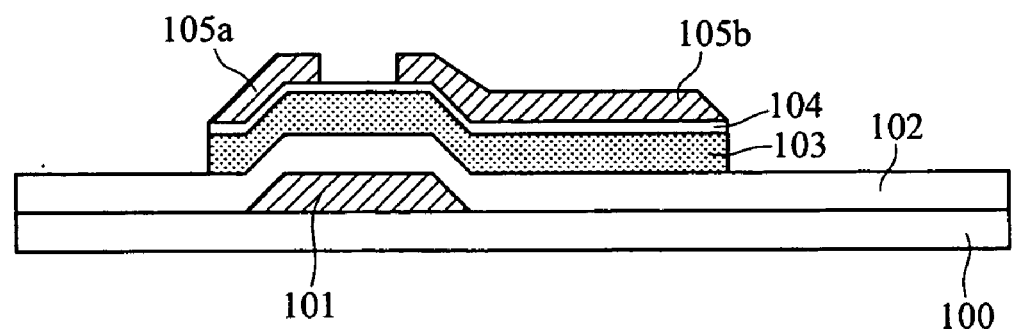
Figure 1D:
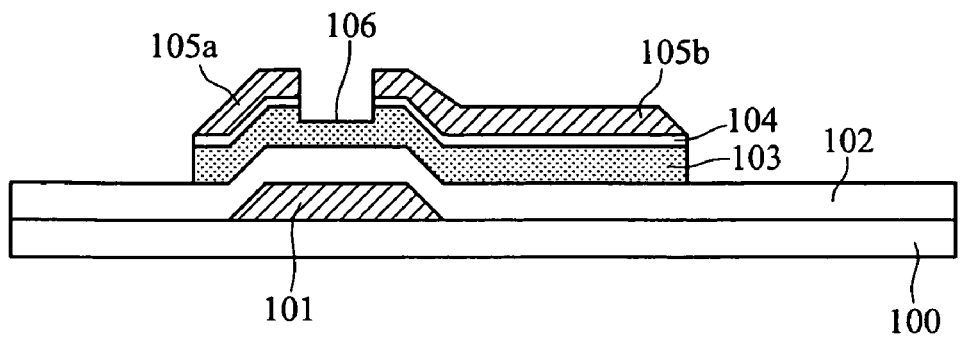
Figure 1E:
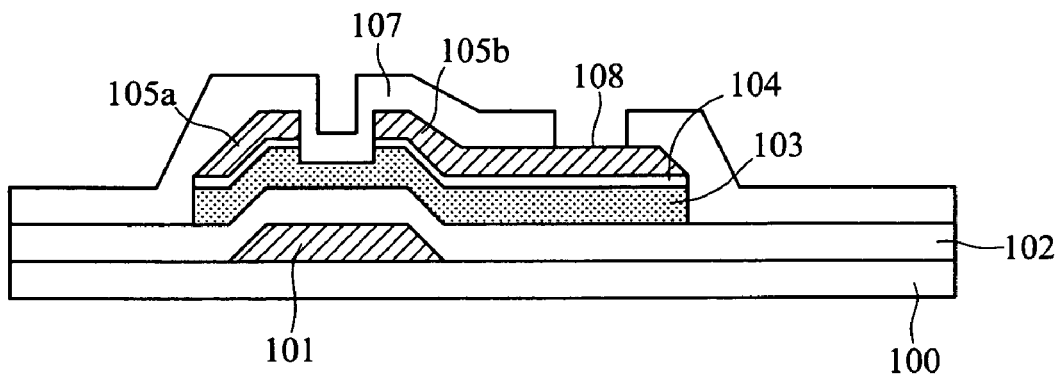
Figure 1F:
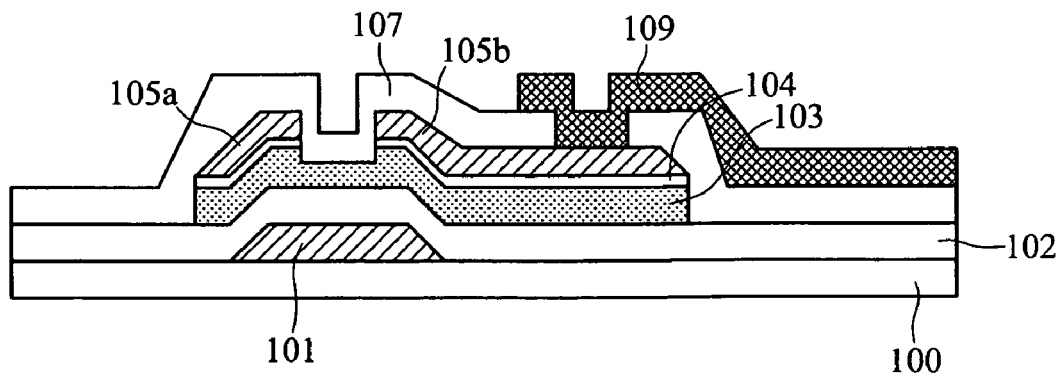
Figure 2A:
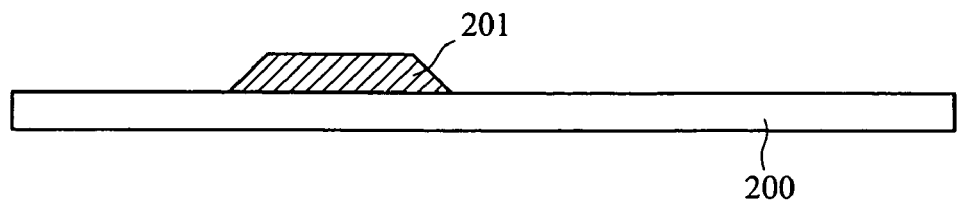
FIGS. 2A to 2J show cross-sectional views of the disclosed TFT fabrication method.

The cross-sectional views of the fabrication process disclosed herein are shown in FIGS. 2A to 2F. As shown in FIG. 2A, a physical vapor deposition (PVD) method such as sputtering is employed to deposit a first metal layer (not shown) on an insulating substrate 200. A photolithographic and etching process is used to etch the first metal layer, forming a gate 201 on the substrate 200. The substrate 200 is alkaline-free glass. The first metal layer can be an AL, Cr, Mo, Al—Nd, or stacked Mo/Al—Nd layer. The etching process is a wet etching or dry etching process.

Figure 2B:
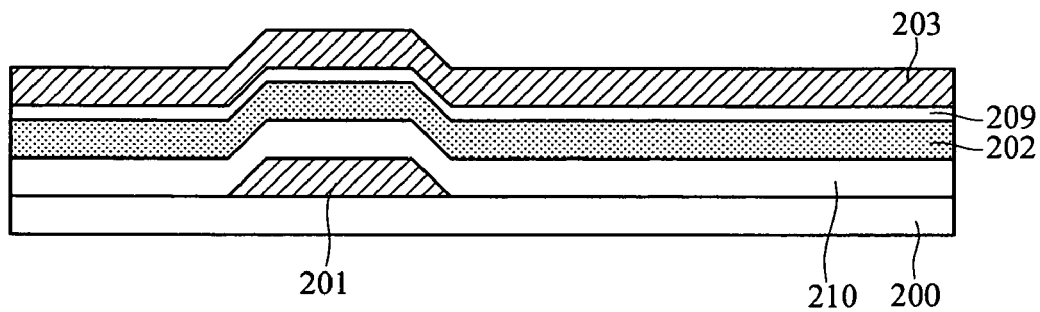

As shown in FIG. 2B, the plasma enhanced chemical vapor deposition (PECVD) method is used to deposit a gate insulation layer 210, a semiconductor layer 202, an ohmic contact layer 209 on the substrate 200 in sequence, which cover the gate 201. A second metal layer 203 is then deposited on the ohmic contact later 209 using a physical vapor deposition (PVD) method such as sputtering. The semiconductor layer 202 can be an amorphous silicon layer.

The ohmic contact layer 209 can be an n-doped amorphous silicon layer. The gate insulation layer 210 can be either a silicon nitride or a silicon dioxide layer. The second metal layer 203 uses a material selected from the group consisting of Al, Cr, Mo, Al—Nd, and stacked Mo/Al—Nd/Mo layers.

Figure 2C:
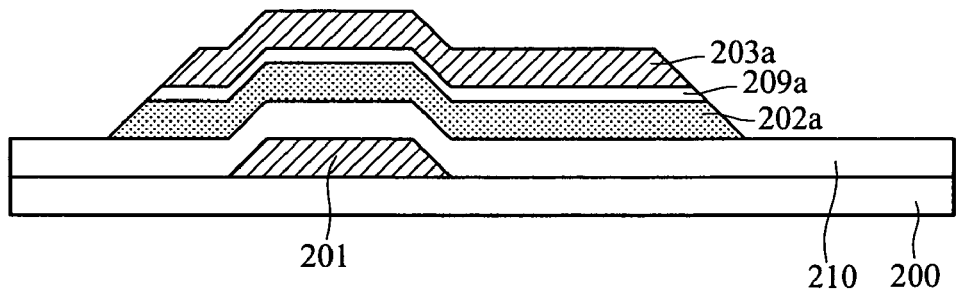

As shown in FIG. 2C, a photolithographic and etching process is used to pattern the second metal layer 203, the ohmic contact layer 209, and the semiconductor layer 202 to form a patterned second metal layer 203a, a patterned ohmic contact layer 209a, and a patterned semiconductor layer 202a. The etching method is wet etching.

Figure 2D:
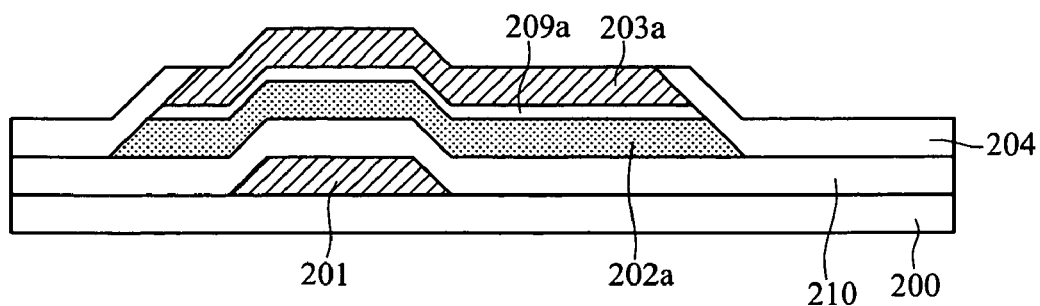

As shown in FIG. 2D, the PECVD method is employed to deposit a first passivation layer (now shown) on the substrate 200 to cover the patterned second metal layer 203a, the patterned ohmic contact layer 209a, and the patterned semiconductor layer 202a. A photolithographic and etching process is further used to etch the first passivation layer, exposing the patterned second metal layer 203a and forming the patterned first passivation layer 204. The first passivation layer uses such materials as silicon nitride or silicon dioxide.

Figure 2E:
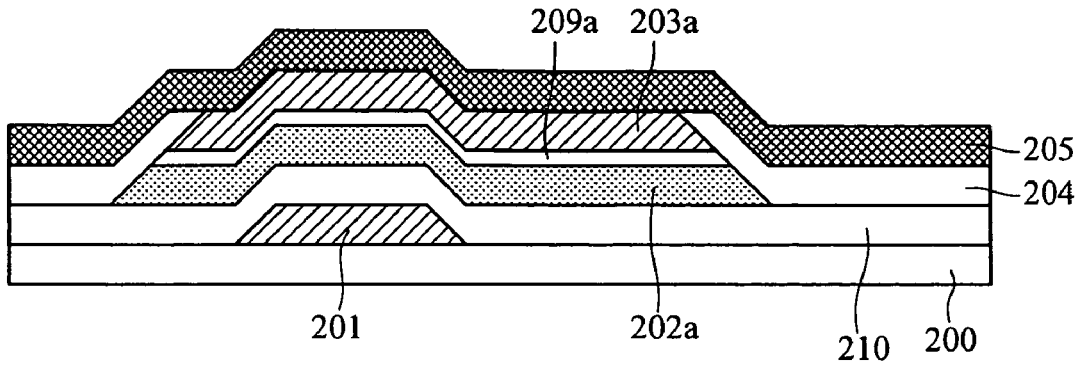

As shown in FIG. 2E, a physical vapor deposition (PVD) method such as sputtering is used to deposit a pixel electrode layer 205 on the substrate 200 to cover the patterned first passivation layer 204 and the patterned second metal layer 203a. The pixel electrode layer 205 can be made of transparent indium tin oxide (ITO).

Figure 2F:
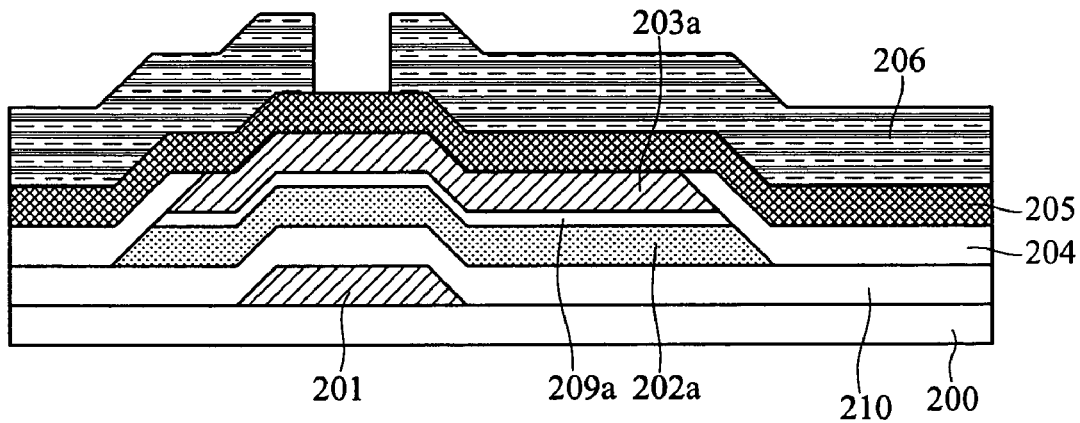
Figure 2G:
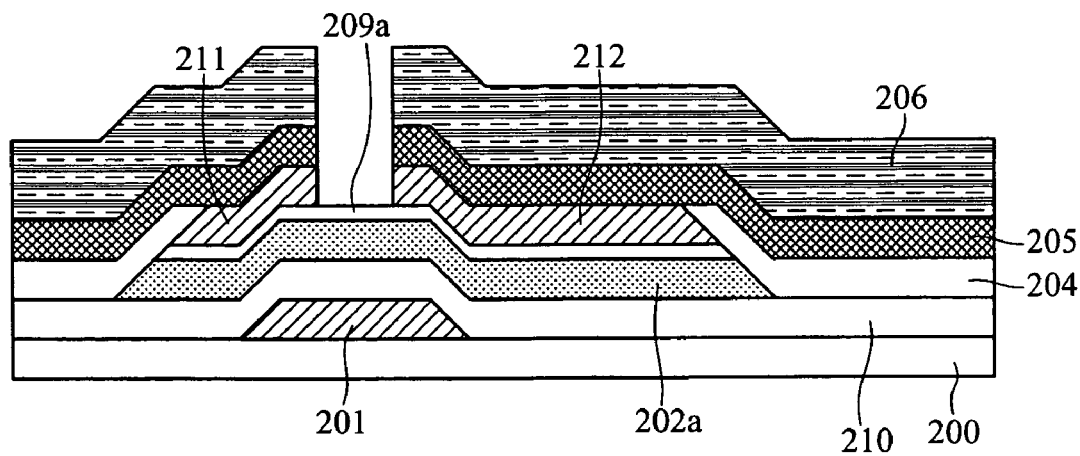
Figure 2H:
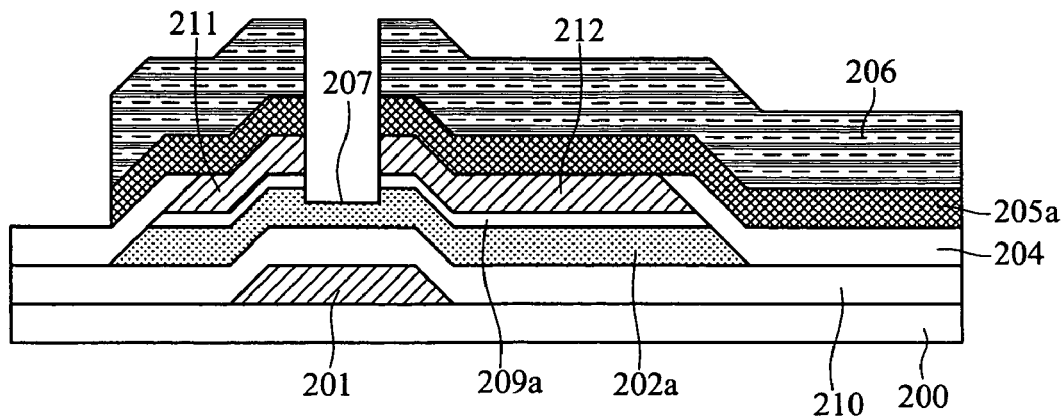

With simultaneous reference to FIGS. 2F, 2G, and 2H, a photolithographic process is further performed. First, a patterned photoresist layer is formed on the substrate, exposing part of the pixel electrode layer above the gate 201. A dry etching method is used to remove the exposed pixel electrode layer 205 and part of the patterned second metal layer 203a under it, forming a source 211, a drain 212, and a patterned pixel electrode layer 205a. A back channel etching (BCE) process is used to etch the exposed, patterned ohmic contact layer 209a and part of the semiconductor layer 202a, forming a channel region 207.

Figure 2I:
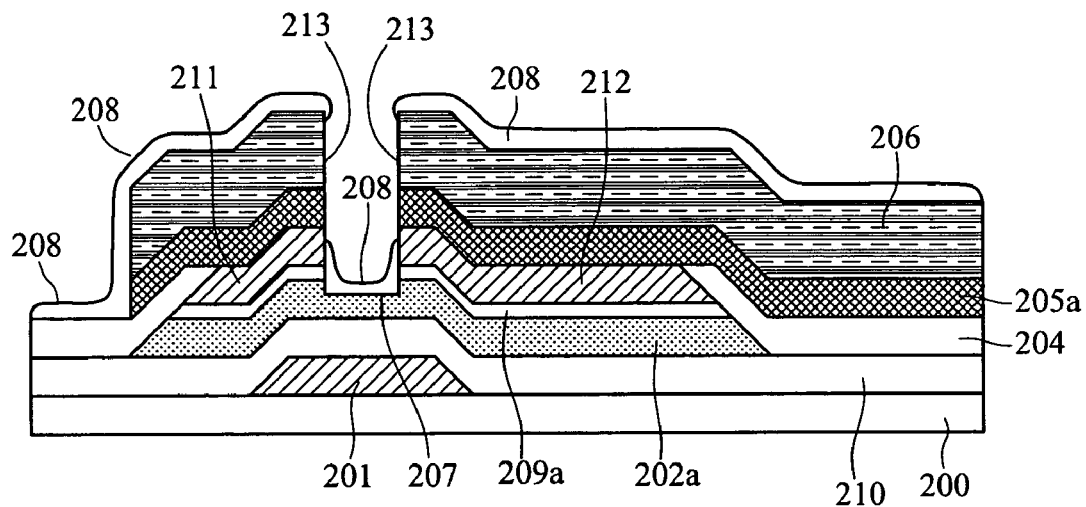

As shown in FIG. 2I, the PECVD method is used to form a second passivation layer 208 on the substrate 200 at a lower temperature about 90° C. to cover the patterned photoresist layer 206 and the channel region 207 but exposing the side 213 of the patterned photoresist layer. The temperature for forming the second passivation layer 208 does not result in the thermal cracking of the patterned photoresist layer 206. The second passivation layer 208 is made of a material such as silicon nitride or silicon oxide.

Figure 2J:
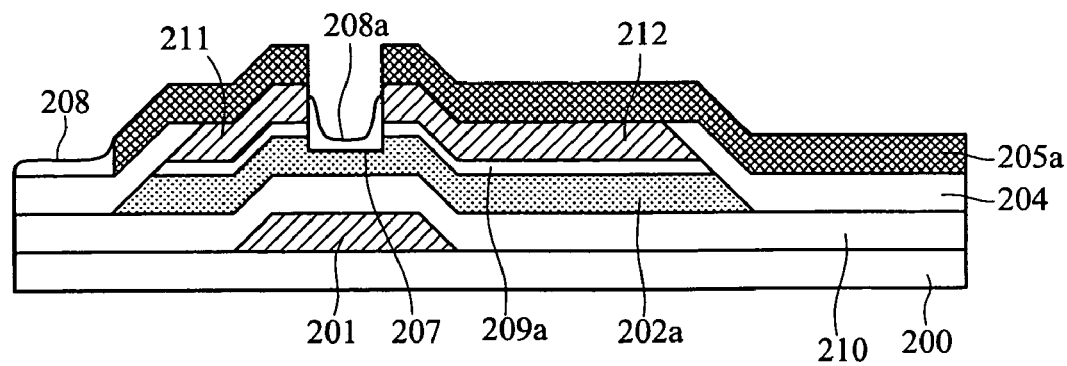

As shown in FIG. 2J, a wet photoresist removal method is used to remove the patterned photoresist layer 206. It is achieved by adding an organic solvent in this process to dissolve the side of the patterned photoresist layer 206. The second passivation layer 208 above the patterned photoresist layer 206 is thus lifted off, thereby exposing the patterned pixel electrode layer 205 above the source 211 and the drain 212 while leaving the patterned second passivation layer 208a covering the channel region 207. This completes the fabrication of the TFT.

In comparison with the conventional manufacturing method of TFT that requires five-mask process, the disclosed TFT fabrication method only requires four-mask process. This can reduce the time and cost of the fabrication, while increasing the yield and production efficiency.

Certain variations would be apparent to those skilled in the art, which variations are considered within the spirit and scope of the claimed invention.

What is claimed is:

1. A thin-film transistor (TFT) fabrication method, which comprises the steps of:
   forming a gate on a substrate;
   forming a gate insulation layer, a semiconductor layer and a metal layer on the substrate in sequence, which cover the gate;
   patterning the metal layer and the semiconductor layer to form a patterned metal layer and a patterned semiconductor layer covering the gate;
   forming a patterned first passivation layer on the substrate and exposing the patterned metal layer;
   forming a pixel electrode layer on the substrate to cover the patterned first passivation layer and the patterned metal layer;
   forming a patterned photoresist layer on the substrate and exposing the pixel electrode layer above the gate;
   etching the pixel electrode layer and the patterned metal layer above the gate to form a patterned pixel electrode layer, a source and a drain to form a channel region on the patterned semiconductor layer;
   forming a second passivation layer on the substrate; and
   removing the patterned photoresist layer to lift off the second passivation layer, thereby exposing the patterned pixel electrode layer.

2. The TFT fabrication method of claim 1, further comprising the step of performing a back channel etching (BCE) process after the step of etching the pixel electrode layer and the patterned metal layer above the gate.

3. The TFT fabrication method of claim 1, wherein the metal layer is made of a material selected from the group consisting of Al, Cr, Mo, Al—Nd alloy, and stacked Mo/Al—Nd alloy/Mo.

4. The TFT fabrication method of claim 1, wherein the gate is made of a material selected from the group consisting of Al, Cr, Mo, Al—Nd alloy, and stacked Mo/Al—Nd alloy/Mo.

5. The TFT fabrication method of claim 1, wherein the first passivation layer is made of silicon nitride.

6. The TFT fabrication method of claim 1, wherein the first passivation layer is made of silicon dioxide.

7. The TFT fabrication method of claim 1, wherein the second passivation layer is made of silicon nitride.

8. The TFT fabrication method of claim 1, wherein the second passivation layer is made of silicon dioxide.

9. The TFT fabrication method of claim 1, wherein the pixel electrode layer is made of indium tin oxide (ITO).

10. The TFT fabrication method of claim 1, wherein the semiconductor layer is an amorphous silicon layer.

11. A thin-film transistor (TFT) fabrication method, which comprises the steps of:
    forming a gate on a substrate;
    forming a gate insulation layer, a semiconductor layer, an ohmic contact layer, and a metal layer on the substrate in sequence, which cover the gate;
    patterning the metal layer, the ohmic contact layer, and the semiconductor layer to form a patterned metal layer, a patterned ohmic contact layer, and a patterned semiconductor layer covering the gate;
    forming a patterned first passivation layer on the substrate and exposing the patterned metal layer;
    forming a pixel electrode layer on the substrate to cover the patterned first passivation layer and the patterned metal layer;
    forming a patterned photoresist layer on the substrate and exposing the pixel electrode layer above the gate;

etching the pixel electrode layer, the patterned ohmic contact layer and the patterned metal layer above the gate to form a patterned pixel electrode layer, a source and a drain and to form a channel region on the patterned semiconductor layer;

forming a second passivation layer on the substrate; and removing the patterned photoresist layer to lift off the second passivation layer, thereby exposing the patterned pixel electrode layer.

12. The TFT fabrication method of claim 11, further comprising the step of performing a back channel etching (BCE) process after the step of etching the pixel electrode layer, the patterned ohmic contact layer and the patterned metal layer above the gate.

13. The TFT fabrication method of claim 11, wherein the ohmic contact layer is a doped silicon layer.

14. The TFT fabrication method of claim 11, wherein the metal layer is made of a material selected from the group consisting of Al, Cr, Mo, Al—Nd alloy, and stacked Mo/Al—Nd alloy/Mo.

15. The TFT fabrication method of claim 11, wherein the gate is made of a material selected from the group consisting of Al, Cr, Mo, Al—Nd alloy, and stacked Mo/Al—Nd alloy/Mo.

16. The TFT fabrication method of claim 11, wherein the first passivation layer is made of silicon nitride.

17. The TFT fabrication method of claim 11, wherein the first passivation layer is made of silicon dioxide.

18. The TFT fabrication method of claim 11, wherein the second passivation layer is made of silicon nitride.

19. The TFT fabrication method of claim 11, wherein the second passivation layer is made of silicon dioxide.

20. The TFT fabrication method of claim 11, wherein the pixel electrode layer is made of indium tin oxide (ITO).

21. The TFT fabrication method of claim 11, wherein the semiconductor layer is an amorphous silicon layer.

* * * * *